(12) United States Patent
Heinrich et al.

(10) Patent No.: US 6,177,808 B1
(45) Date of Patent: Jan. 23, 2001

(54) INTEGRATION OF BIDIRECTIONAL SWITCHES WITH PROGRAMMABLE LOGIC

(75) Inventors: David F. Heinrich, Tomball; Saimak Tavallaei, Spring; Barry S. Basile, Houston, all of TX (US)

(73) Assignee: Compaq Computer Corporation, Houston, TX (US)

( * ) Notice: Under 35 U.S.C. 154(b), the term of this patent shall be extended for 0 days.

(21) Appl. No.: 09/070,937

(22) Filed: Apr. 30, 1998

(51) Int. Cl.[7] ................................................ H03K 19/003
(52) U.S. Cl. .................. 326/57; 326/86; 326/37
(58) Field of Search .................. 326/30, 37–39, 326/83, 86, 49, 57

(56) References Cited

U.S. PATENT DOCUMENTS

| Re. 34,363 | * | 8/1993 | Freeman | 326/41 |
|---|---|---|---|---|
| 4,713,557 | * | 12/1987 | Carter | 326/86 |
| 4,758,985 | * | 7/1988 | Carter | 326/41 |
| 4,835,418 | * | 5/1989 | Hsieh | 326/86 |
| 4,987,319 | * | 1/1991 | Kawana | 326/86 |
| 5,705,937 | * | 1/1998 | Yap | 326/30 |
| 5,736,870 | * | 4/1998 | Greason et al. | 326/86 |

* cited by examiner

*Primary Examiner*—Jon Santamauro
*Assistant Examiner*—Don Pau Le
(74) *Attorney, Agent, or Firm*—Akin, Gump, Strauss, Hauer & Feld, LLP

(57) ABSTRACT

In electronic systems, signaling problems frequently occur when a device is driving a signal on a line to an incorrect level at a particular point in time. When production schedules do not permit fixing the defects in the errant device, programmable logic has been employed to work around the problems caused by the defective device. Higher device speeds and increasingly complex bus protocols have made the technique of singly using programmable logic, more difficult to implement. The addition of bidirectional switches integrated with and controlled by programmable logic in a monolithic integrated circuit allows the programmable logic device to respond more quickly while at the same time consuming less printed circuit board space. Additionally, the invention provides for termination of the isolated device and/or signal line stubs.

54 Claims, 3 Drawing Sheets

INTEGRATION OF BIDIRECTIONAL SWITCHES WITH PROGRAMMABLE LOGIC

BACKGROUND OF THE INVENTION

1. Field of the Invention

The invention relates to the integration of bidirectional switches with programmable logic to solve electronic signaling problems.

2. Description of the Related Art

Design defects are often encountered during development of electronic systems. When production schedules do not permit fixing the defects in the errant devices, or when the problem source cannot be isolated, programmable logic can be employed to both work around and identify the problems caused by the defective devices.

A programmable logic device (PLD) is a circuit which can be configured by the customer, to perform needed logic functions. Most standard PLDs consist of an AND array followed by an OR array, both of which may be programmable. The inputs are coupled to the AND array, which performs the AND functions and generates product terms. The product terms are coupled to the OR array. The OR array combines (sums) the outputs of the various product terms to produce the desired outputs. Programmable array logic (PAL) is a PLD that has a programmable AND array followed by a fixed OR array. Programmable logic and the basics of programming it are well known to those with ordinary skill in the art. The term programmable logic will be used for PLDs, PALs, and related logic such as gate arrays and programmable state machines. Programmable logic can be used for tracking bus states, configuring dynamically alterable state machines and a variety of other tasks.

Programmable logic can be used to decode errant signals from digital devices. Programmable logic has been used to work around defects in devices in some systems by using programmable logic that supports bidirectional signals. The signal from the errant device would be passed through transceivers in the programmable logic and on to the remainder of the system. In normal operation, the programmable logic would control the direction of the transceivers as appropriate, based on other signals in the system. To isolate the errant signal from the rest of the system, the transceivers could be disabled, and then the programmable logic would directly drive the signal to the system.

This technique, however, required the transceiver direction to be controlled by the programmable logic. This could become quite complicated for some signals.

Further, as clock speeds increased, timing problems also arose. Using multiple discrete devices could result in stub length and termination issues that in turn caused signal degradation and timing problems. Typical device isolation and debugging solutions often did not avoid these issues.

If an errant device was disconnected from the signal path problems associated with signal reflection could occur. Reflections from improperly terminated stubs could cause abnormal conditions within a system. As signal frequencies increased the possibility of reflections increased and the need for proper termination became important.

SUMMARY OF THE PRESENT INVENTION

A system according to the invention provides a bidirectional switch, such as a FET switch or a transmission gate, as an integral part of a programmable logic device. The switch is controlled by an enable signal in the programmable logic itself. By employing the onboard switch, a signal from a device can be isolated without requiring directional signal control and with a single part—the programmable logic device itself.

In one embodiment, the programmable logic device decodes the signal from the errant device on the signal line and provides the correct signal for the time in which the errant device is improperly functioning.

In another embodiment, bidirectional switches are again used to isolate a signal, but at the same time maintaining appropriate signal line termination. When a signal line to be isolated is split in two by a bidirectional switch, two other switches simultaneously switch in terminations, such as pull up resistors, to the new "ends" of each of the two segments. In still another embodiment, one bidirectional switch terminates the stub connected to the errant device and another bidirectional switch connects the other stub to the programmable logic for providing the correct signal.

Bidirectional switches are high-speed signal line connect devices having low impedance transmission gates which connect two signals. Unlike transceivers, the transmission gates allow current to flow in either direction without directional control. A signal driven by the programmable logic controls the bidirectional switch to isolate the errant transmitting device from the receiving device and drive the line with the appropriate logic level for the appropriate period. The new technique preferably implements the programmable logic and the bidirectional switch on a monolithic integrated circuit. Integration achieves a significant advantage by reducing the time required for the programmable logic to respond to a signal and then turn on or off an individual bidirectional switch element. Further, trace lengths are reduced.

Bidirectional switches provide an advantage over tristateable buffers, or transceivers, because the buffers must be continually controlled when the signal line is bidirectional. The logic to control a tristateable buffer or transceiver is generally more complex than can easily be modeled in a standard programmable logic chip.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Computer System Overview

Figure 1:
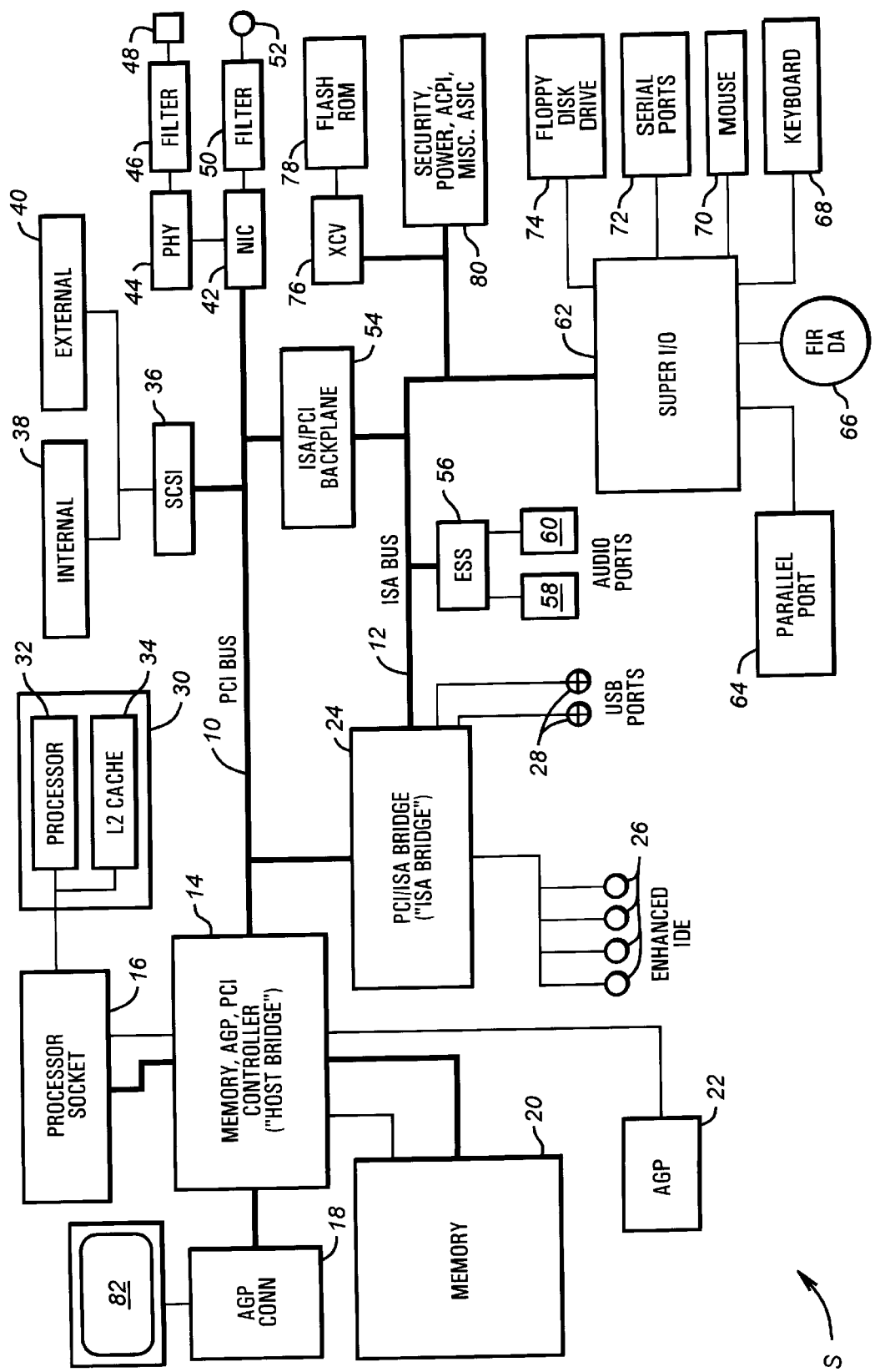
FIG. 1 is a block diagram illustrating a typical computer system S.

Turning to FIG. 1, illustrated is a typical computer system S implemented according to the invention. While this system is illustrative of one embodiment, the techniques according to the invention can be implemented in a wide variety of systems. The computer system S in the illustrated embodiment is a PCI bus/ISA bus based machine, having a peripheral component interconnect (PCI) bus 10 and an industry standard architecture (ISA) bus 12. The PCI bus 10 is controlled by PCI controller circuitry located within a memory/accelerated graphics port (AGP)/PCI controller 14. This controller 14 (the "host bridge") couples the PCI bus 10 to a processor socket 16 via a host bus, an AGP connector 18, a memory subsystem 20, and an AGP 22. A second bridge circuit, a PCI/ISA bridge 24 (the "ISA bridge") bridges between the PCI bus 10 and the ISA bus 12.

The host bridge 14 in the disclosed embodiment is a 440LX Integrated Circuit by Intel Corporation, also known as the PCI AGP Controller (PAC). The ISA bridge 24 is a PIIX4, also by Intel Corporation. The host bridge 14 and ISA bridge 24 provide capabilities other than bridging between the processor socket 16 and the PCI bus 10, and the PCI bus 10 and the ISA bus 12. Specifically, the disclosed host bridge 14 includes interface circuitry for the AGP connector 18, the memory subsystem 20, and the AGP 22. The ISA bridge 24 further includes an internal enhanced IDE controller for controlling up to four enhanced IDE drives 26, and a universal serial bus (USB) controller for controlling USB ports 28.

The host bridge 14 is preferably coupled to the processor socket 16, which is preferably designed to receive a Pentium II processor module 30, which in turn includes a microprocessor core 32 and a level two (L2) cache 34. The processor socket 16 could be replaced with different processors other than the Pentium II without detracting from the spirit of the invention.

The host bridge 14, when the Intel 440LX North Bridge is employed, supports extended data out (EDO) dynamic random access memory (DRAM) and synchronous DRAM (SDRAM), a 64/72-bit data path memory, a maximum memory capacity of one gigabyte, dual inline memory module (DIMM) presence detect, eight row address strobe (RAS) lines, error correcting code (ECC) with single and multiple bit error detection, read-around-write with host for PCI reads, and 3.3 volt DRAMs. The host bridge 14 support up to 66 megahertz DRAMs, whereas the processor socket 16 can support various integral and non-integral multiples of that speed.

The ISA bridge 24 also includes enhanced power management. It supports a PCI bus at 30 or 33 megahertz and an ISA bus 12 at ¼ of the PCI bus frequency. PCI revision 2.1 is supported with both positive and subtractive decode. The standard personal computer input/output (I/O) functions are supported, including a direct memory access (DMA) controller, two 82C59 interrupt controllers, an 8254 timer, a real time clock (RTC) with a 256 byte complementary metal oxide semiconductor (CMOS) static RAM (SRAM), and chip selects for system read only memory (ROM), RTC, keyboard controller, an external microcontroller, and two general purpose devices. The enhanced power management within the ISA bridge 24 includes full clock control, device management, suspend and resume logic, advanced configuration and power interface (ACPI), and system management bus (SMBus) control, which implement the inter-integrated circuit (I$^2$C) protocol.

The PCI bus 10 couples a variety of devices that generally take advantage of a high speed data path. This includes a small computer system interface (SCSI) controller 36, with both an internal port 38 and an external port 40. In the disclosed embodiment, the SCSI controller 36 is a AIC-7860 SCSI controller. Also coupled to the PCI bus 10 is a network interface controller (NIC) 42, which preferably supports the ThunderLan$^{TN}$ power management specification by Texas Instruments. The NIC 42 is coupled through a physical layer 44 and a filter 46 to an RJ-45 jack 48, and through a filter 50 to a AUI jack 52.

Between the PCI Bus 10 and the ISA Bus 12, an ISA/PCI backplane 54 is provided which include a number of PCI and ISA slots. This allows ISA cards or PCI cards to be installed into the system for added functionality.

Further coupled to the ISA Bus 12 is an enhanced sound system chip (ESS) 56, which provides sound management through an audio in port 58 and an audio out port 60. The ISA bus 12 also couples the ISA bridge 24 to a Super I/O chip 62, which in the disclosed embodiment is a National Semiconductor Corporation PC87307VUL device. This Super I/O chip 62 provides a variety of input/output functionality, including a parallel port 64, an infrared port 66, a keyboard controller for a keyboard 68, a mouse port for a mouse port 70, additional series ports 72, and a floppy disk drive controller for a floppy disk drive 74. These devices are coupled through connectors to the Super I/O 62.

The ISA bus 12 is also coupled through bus transceivers 76 to a flash ROM 78, which can include both basic input/output system (BIOS) code for execution by the processor 32, as well as an additional code for execution by microcontrollers in a ROM-sharing arrangement.

The ISA bus 12 further couples the ISA bridge 24 to a security, power, ACPI, and miscellaneous application specific integrated circuit (ASIC) 80, which provides a variety of miscellaneous functions for the system. The ASIC 80 includes security features, system power control, light emitting diode (LED) control, a PCI arbiter, remote wake up logic, system fan control, hood lock control, ACPI registers and support, system temperature control, and various glue logic.

Finally, a video display 82 can be coupled to the AGP connector 18 for display of data by the computer system S.

Again, a wide variety of systems could be used instead of the disclosed system S without detracting from the spirit of the invention.

Figure 2:
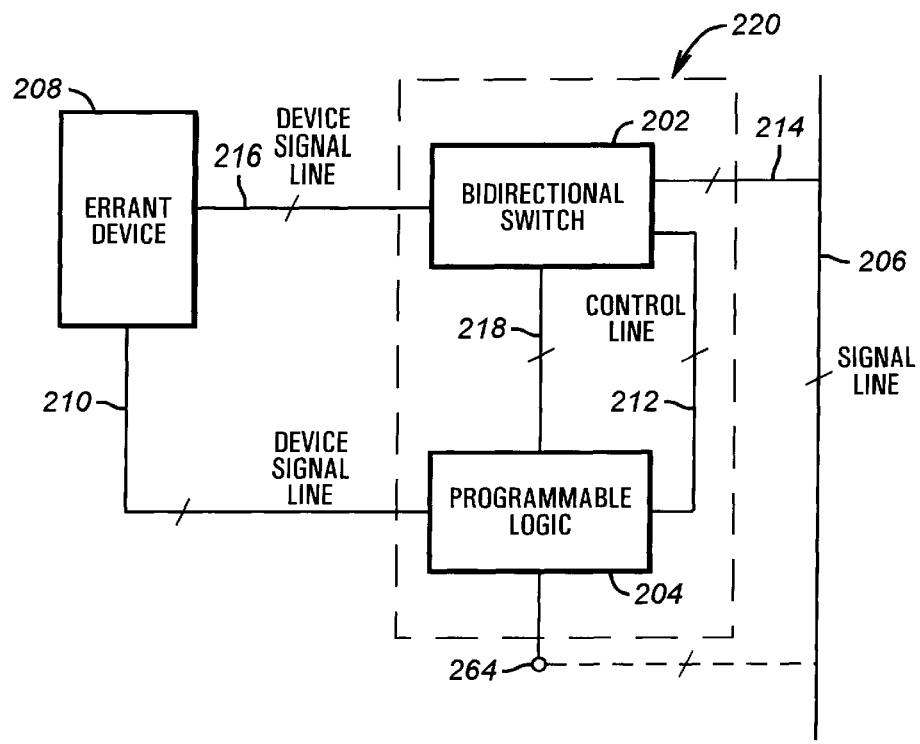
FIG. 2 is a block diagram illustrating a bidirectional switch integrated with programmable array logic PAL according to the present invention.

Implementation of Bidirectional Switches with Programmable Logic According to the Present Invention Referring now to FIG. 2, a bidirectional switch 202 integrated with programmable logic 204 according to the present invention is shown. The bidirectional switch 202 may be connected to external conductors via conductors or resistors (not shown). Again, the programmable logic 204 could implement various state machines, be a PLD, a PAL or related logic such as a gate array. The signal line 206 could be an ISA bus, a PCI bus, or another input/output signal line, or could instead simply be various digital lines. Signal line 214 couples the signal line 206 to the bidirectional switch 202. Device signal line 216 couples the bidirectional switch 202 to the errant device 208. Device signal line 210 couples the errant devices 208 to the programmable logic 204. The errant device 208 could include, among other things, the processor 32, the host bridge 14, or the ISA bridge 24 (see FIG. 1). The programmable logic 204: decodes device signal line 210 from the errant device 208, controls the bidirectional switch 202 via a control line 212, and provides a signal, via signal line 218 through the bidirectional switch 202, to the signal line 206 by way of signal line 214 when the errant device 208 is operating improperly. In another embodiment, the programmable logic 204 provides signals to the signal line 206 through an external connection 264.

A major advantage of using the bidirectional switch 202 is that it typically provides less delay than bus transceivers, which simplifies the control logic required. Further, providing the bidirectional switch 202 and the programmable logic 204 within the programmable logic device 220, a great deal of decoding logic within the programmable logic device 220 can be eliminated. Specifically, although the device signal line 210 is shown as a single line, it could be a plurality of signal lines to which the programmable logic 204 responds in switching the bidirectional switch 202. If bus transceivers are instead used according to the prior art, the programmable logic 204 would have to decode not only when the errant device 208 is improperly operating, but also control the direction of the transceivers themselves as well as providing the appropriate signals to signal line 206.

When the errant device 208 is functioning properly, its output is routed through the bidirectional switch 202, via signal lines 216 and 214, to the signal line 206. When the errant device 208 is improperly functioning, the programmable logic 204 asserts the control line 212 to the bidirectional switch 202 and disconnects the errant device 208 from the signal line 206. With the errant device 208 disconnected from the signal line 206, the programmable logic 204 provides the correct logic levels to the signal line 206, via signal lines 218 and 214. In one embodiment the bidirectional switch 202 and the programmable logic 204 are separate devices. In another embodiment the bidirectional switch 202 and the programmable logic 204 are integrated within a single chip 220.

Figure 3:
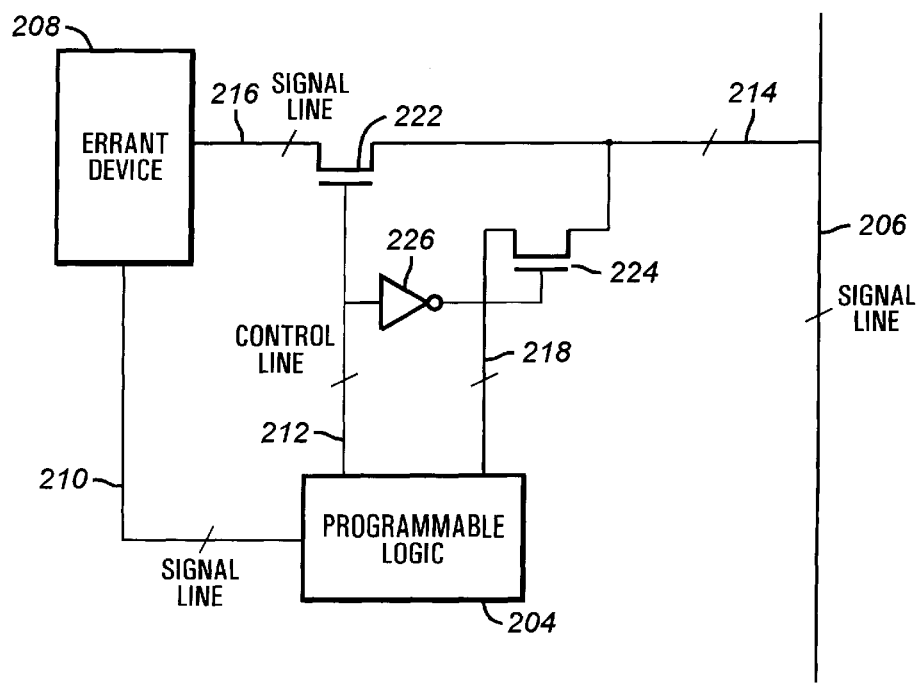
FIG. 3 is a diagram further illustrating a simplified bidirectional switch as implemented according to the present invention.

Moving to FIG. 3, a simplified portion of the bidirectional switch 202 of FIG. 2 is depicted. The control line 212 from the programmable logic 204 is directly coupled to the gate of device 222 and coupled to the gate of device 224 through an inverter 226. When the output of the control line 212 from the programmable logic 204 is low either gate 222 or 224 will be enabled depending on the type of FET used. When device 222 is on, device 224 is off. When device 224 is on device 222 is off. In this manner the errant device 208 can be isolated from the signal line 206 when the programmable logic 204 is required to drive the correct logic level on the signal line 206. When the errant device 208 is operating correctly the programmable logic 204 is isolated from the signal line 206.

In actual implementation, the FET devices 222 and 224 would typically be implemented in the form of a number of physical FET devices so arranged to form a typical, bidirectional FET switch transmission gate. But for purposes of clarity in FIG. 3, these are instead shown as single devices. In general, a variety of devices could be used as the bidirectional switch 202 as long as they conduct current in both directions.

Figure 4:
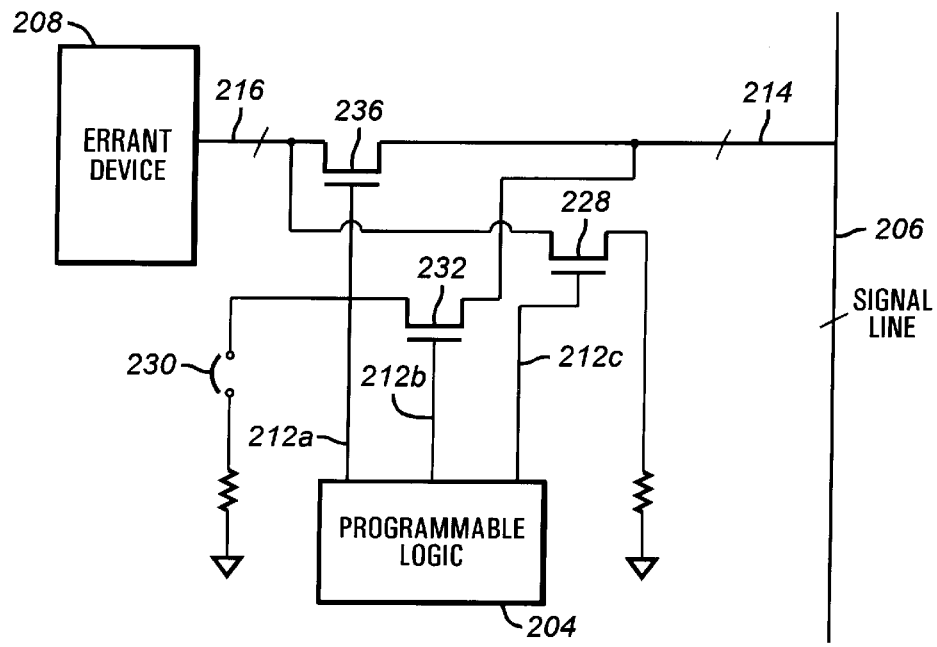
FIG. 4 is a schematic diagram of another embodiment of the bidirectional switch which provides for line termination implemented according to the present invention.

FIG. 4 illustrates an embodiment of the bidirectional switch that provides for line termination. In one embodiment individual switches 236, 228 and 232 may be individually controlled by control lines 212a–c from the programmable logic 204. If it is not desirable to drive a signal on the signal line 206 with the programmable logic 204: one stub of the device signal line 216 can be terminated by enabling switch 228 when switch 236 is disabled, and the other stub of the device signal line 214 can be terminated by enabling switch 232 if jumper 230 is installed. If the programmable logic 204 is also to provide the drive signal, then another switch (not shown) will couple the programmable logic 204 to the signal line 206. In an embodiment in which external terminators are desired, external resistors may be added as needed for proper termination. In yet another embodiment (not shown) the terminators, the bidirectional switches, the programmable logic, and active terminators are implemented on the monolithic integrated circuit.

Figure 5A:
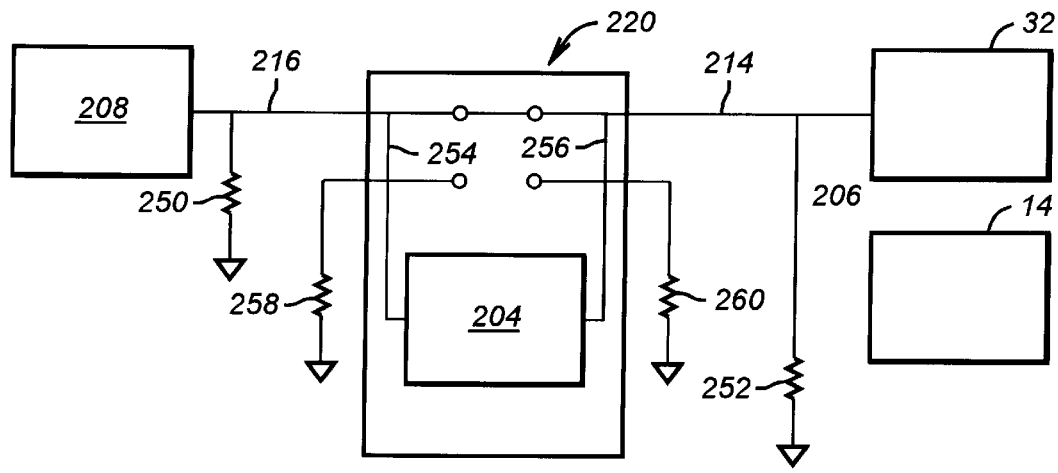
FIGS. 5A and 5B are illustrations of the device of FIG. 4 in operation.
Figure 5B:
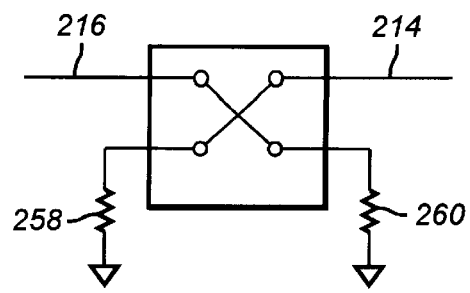

Turning to FIGS. 5A and 5B, illustrated is the device of FIG. 4 as it would switch appropriate terminations into and out of the signal path formed by the signal line 216 and 214. In the operating mode of FIG. 5A, the programmable logic 204 has turned on the switch 236 of FIG. 4 and turned off the switches 228 and 232 of FIG. 4. Thus, the signal line 216 is coupled to the signal line 214. In this mode, it is seen that at the ends of the signal line are a termination resistor 250 and a second termination resistor 252 which provide appropriate termination by the line formed by the combined signal lines 216 and 214. Although the programmable logic 204 is shown coupled to the signal line 216 via a conductor 254 and to the signal line 214 via a conductor 256, these conductors 254 and 256 are preferably tri-stated by the programmable logic 204.

Turning to FIG. 5B, shown are the connections formed by the programmable logic device 220 when the signal lines 216 and 214 are decoupled. In this mode, the programmable logic 204 switches off the transistor 236, and turns on the transistors 228 and 232 of FIG. 4. In this mode, two external resistors 258 and 260 are correspondingly coupled to the signal lines 214 and 216, so that the signal lines 214 and 216 then form two separate signal lines with appropriate termination resistance. This can prevent or reduce ringing and reflections when the errant device 208 is decoupled from the signal line 206.

Again, according to the invention, bidirectional switches are employed on a programmable logic device and switched by programmable logic on the device. This permits errant devices to be switched into and out of circuitry without requiring extensive directional logic to control transceivers on the programmable logic device.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A programmable logic device for use with an errant device having a device signal line to be selectively isolated from a signal line in a system, the programmable logic device comprising:

a first bidirectional switch having a high off resistance and a low on resistance on a monolithic integrated circuit, the first bidirectional switch having a first terminal electrically coupled to a first external conductor for connection to the device signal line and a second terminal electrically coupled to a second external conductor for connection to the signal line, the first bidirectional switch being controlled by an enable signal; and programmable logic providing the enable signal, the programmable logic implemented on the monolithic integrated circuit.

2. The programmable logic device of claim 1, wherein the programmable logic controls the enable signal based upon other signals from the errant device and the system.

3. The programmable logic device of claim 1, wherein the programmable logic is a programmable array logic (PAL).

4. The programmable logic device of claim 1, wherein the programmable logic is a programmable state machine.

5. The programmable logic device of claim 1, wherein the programmable logic is a gate array.

6. The programmable logic device of claim 1, wherein the first bidirectional switch is a field effect transistor (FET).

7. The programmable logic device of claim 1, wherein the first bidirectional switch is a transmission gate.

8. The programmable logic device of claim 1, wherein the first bidirectional switch is directly connected to the external conductors via conductors.

9. A programmable logic device of claim 1, wherein the first bidirectional switch is directly connected to the first external conductor via a first resistor and directly connected to the second external conductor via a second resistor.

10. The programmable logic device of claim 1, wherein the programmable logic device further comprises:
a second bidirectional switch having a high off resistance and a low on resistance on the monolithic integrated circuit, the second bidirectional switch having a first terminal electrically coupled to the programmable logic and a second terminal electrically coupled to the second terminal of the first bidirectional switch for connection to the signal line, the second bidirectional switch being inversely controlled by the enable signal; and
programmable logic to drive the signal line when the first bidirectional switch is disabled.

11. The programmable logic device of claim 1, wherein the programmable logic includes logic to drive the signal line and the programmable logic is externally coupled to the signal line when the first bidirectional switch is disabled.

12. A programmable logic device for use with an errant device having a device signal line to be selectively isolated from a signal line and properly terminated, the programmable logic device comprising:
a first bidirectional switch having a high off resistance and a low on resistance, the first bidirectional switch having a first terminal electrically coupled to a first external conductor for connection to the device signal line and a second terminal electrically coupled to a second external conductor for connection to the signal line, the first bidirectional switch being inversely controlled by an enable signal;
a second bidirectional switch having a high off resistance and a low on resistance, the second bidirectional switch having a first terminal electrically coupled to the first terminal of the first bidirectional switch and a second terminal electrically coupled to a terminator, the second bidirectional switch being controlled by the enable signal; and programmable logic providing the enable signal.

13. The programmable logic device of claim 12, wherein the bidirectional switches and the programmable logic are implemented on a monolithic integrated circuit.

14. The programmable logic device of claim 12, wherein the terminator is active and wherein the terminator, the bidirectional switches, and the programmable logic are implemented on a monolithic integrated circuit.

15. The programmable logic device of claim 12, wherein the terminator is passive.

16. The programmable logic device of claim 12, wherein the programmable logic controls the enable signal based upon other signals from the errant device and the system.

17. The programmable logic device of claim 12, wherein the programmable logic is a programmable array logic (PAL).

18. The programmable logic device of claim 12, wherein the programmable logic is a programmable state machine.

19. The programmable logic device of claim 12, wherein the programmable logic is a gate array.

20. The programmable logic device of claim 12, wherein the first and second bidirectional switches are field effect transistors (FET).

21. The programmable logic device of claim 12, wherein the first and second bidirectional switches are transmission gates.

22. The programmable logic device of claim 12, wherein the first and second bidirectional switches are directly connected to the external conductors via conductors.

23. The programmable logic device of claim 12, wherein the first and second bidirectional switches are directly connected to the external conductors via resistors.

24. The programmable logic device of claim 12, the programmable logic device further comprising:
a third bidirectional switch having a high off resistance and a low on resistance, the third bidirectional switch having a first terminal electrically coupled to the second terminal of the first bidirectional switch and a second terminal electrically coupled to the programmable logic for connection to the signal line, the third bidirectional switch being controlled by the enable signal;
a fourth bidirectional switch having a high off resistance and a low on resistance, the fourth bidirectional switch having a first terminal electrically coupled to the second terminal of the second bidirectional device and a second terminal electrically coupled to the second terminal of the third bidirectional switch, the fourth bidirectional switch being inversely controlled by the enable signal; and
programmable logic which includes logic to drive the signal line, wherein the programmable logic is coupled to the signal line by the third bidirectional switch when the first bidirectional switch is disabled.

25. The programmable logic device of claim 24, wherein the bidirectional switches and the programmable logic are implemented on a monolithic integrated circuit.

26. The programmable logic device of claim 12, wherein the programmable logic includes logic to drive the signal line and is externally coupled to the signal line when the first bidirectional switch is disabled.

27. A computer system capable of isolating an errant device providing an erroneous signal, comprising:
a device signal line from the errant device;
a signal line to be selectively isolated from the device signal line;
a processor coupled to the signal line for providing signals;
a mass storage device coupled to the processor; and
a programmable logic device for use with a device having a device signal line to be selectively isolated from a signal line, the programmable logic device comprising:
a first bidirectional switch having a high off resistance and a low on resistance on a monolithic integrated circuit, the first bidirectional switch having a first terminal electrically coupled to a first external conductor for connection to the device signal line and a second terminal electrically coupled to a second external conductor for connection to the signal line, the first bidirectional switch being controlled by a enable signal; and
programmable logic providing the enable signal, the programmable logic implemented on the monolithic integrated circuit.

28. The computer system of claim 27, wherein the programmable logic controls the enable signal based upon other signals from the errant device and the system.

29. The computer system of claim 27, wherein the programmable logic is a programmable array logic (PAL).

30. The computer system of claim 27, wherein the programmable logic is a programmable state machine.

31. The computer system of claim 27, wherein the programmable logic is a gate array.

32. The computer system of claim 27, wherein the first bidirectional switch is a field effect transistor (FET).

33. The computer system of claim 27, wherein the first bidirectional switch is a transmission gate.

34. The computer system of claim 27, wherein the first bidirectional switch is directly connected to the external conductors via conductors.

35. The computer system of claim 27, wherein the first bidirectional switch is directly connected to the external conductors via resistors.

36. The computer system of claim 27 with the additional capability of supplying a correct signal, wherein the programmable logic device further comprises:
   a second bidirectional switch having a high off resistance and a low on resistance on the monolithic integrated circuit, the second bidirectional switch having a first terminal electrically coupled to the programmable logic and a second terminal electrically coupled to a second terminal of the first bidirectional switch for connection to the signal line, the second bidirectional switch being inversely controlled by the enable signal; and
   programmable logic to drive the signal line when the first bidirectional switch is disabled.

37. The computer system of claim 27 with the additional capability of supplying a correct signal, wherein the programmable logic includes logic to drive the signal line and the programmable logic is externally coupled to the signal line when the first bidirectional switch is disabled.

38. A computer system capable of isolating and properly terminating an errant device providing an erroneous signal, comprising:
   a device signal line from the errant device to be terminated;
   a signal line to be selectively isolated from the device signal line and terminated;
   a processor coupled to the signal line for providing signals;
   a mass storage device coupled to the processor; and
   a programmable logic device for use with the errant device having the device signal line to be selectively isolated from the signal line and properly terminated, the programmable logic device comprising:
      a first bidirectional switch having a high off resistance and a low on resistance, the first bidirectional switch having a first terminal electrically coupled to a first external conductor for connection to the device signal line and a second terminal electrically coupled to a second external conductor for connection to the signal line, the first bidirectional switch being inversely controlled by an enable signal;
      a second bidirectional switch having a high off resistance and a low on resistance, the second bidirectional switch having a first terminal electrically coupled to the first terminal of the first bidirectional switch and a second terminal electrically coupled to a terminator, the second bidirectional switch being controlled by the enable signal; and
      programmable logic providing the enable signal.

39. The computer system of claim 38, wherein the bidirectional switches and the programmable logic are implemented on a monolithic integrated circuit.

40. The computer system of claim 38, wherein the terminator is active and wherein the terminator, the bidirectional switches, and the programmable logic are implemented on a monolithic integrated circuit.

41. The computer system of claim 38, wherein the terminator is passive.

42. The computer system of claim 38, wherein the programmable logic controls the enable signal based upon other signals from the errant device and the computer system.

43. The computer system of claim 38, wherein the programmable logic is a programmable array logic (PAL).

44. The computer system of claim 38, wherein the programmable logic is a programmable state machine.

45. The computer system of claim 38, wherein the programmable logic is a gate array.

46. The computer system of claim 38, wherein the bidirectional switches are field effect transistors (FET).

47. The computer system of claim 38, wherein the bidirectional switches are transmission gates.

48. The computer system of claim 38, wherein the bidirectional switches are directly connected to the external conductors via conductors.

49. The computer system of claim 38, wherein the bidirectional switches are directly connected to the external conductors via resistors.

50. The computer system of claim 38 with the additional capability of supplying a correct signal, wherein the programmable logic device further comprises:
   a third bidirectional switch having a high off resistance and a low on resistance, the third bidirectional switch having a first terminal electrically coupled to the second terminal of the first bidirectional switch and a second terminal electrically coupled to the programmable logic for internally coupling the programmable logic to the signal line, the third bidirectional switch being controlled by the enable signal;
   a fourth bidirectional switch having a high off resistance and a low on resistance, the fourth bidirectional switch having a first terminal electrically coupled to the second terminal of the second bidirectional device and a second terminal electrically coupled to the second terminal of the third bidirectional switch, the fourth bidirectional switch being inversely controlled by the enable signal; and
   programmable logic which includes logic to drive the signal line, wherein the programmable logic is coupled to the signal line by the third bidirectional switch when the first bidirectional switch is disabled.

51. The computer system of claim 50, wherein the bidirectional switches and the programmable logic are implemented on a monolithic integrated circuit.

52. The computer system of claim 38 with the additional capability of supplying a correct signal, wherein the programmable logic includes logic to drive the signal line and the programmable logic is externally coupled to the signal line when the first bidirectional switch is disabled.

53. A method for correcting an errant signal on a signal line within a system, the method comprising the steps of:
   decoding the errant signal from an errant device with programmable logic, to determine when a device signal line should be isolated from the signal line;
   isolating the device signal line from the signal line by disconnecting the device signal line from the signal line with a first bidirectional switch when the errant device functions incorrectly, wherein the first bidirectional switch is inversely controlled by an enable signal from the programmable logic;
   connecting the programmable logic to the signal line with a second bidirectional switch when the errant device functions incorrectly, wherein the second bidirectional switch is controlled by the enable signal from the programmable logic;

driving the signal line to the correct level with the programmable logic, until the errant device functions correctly;

disconnecting the programmable logic from the signal line with the second bidirectional switch when the errant device is functioning correctly; and connecting the errant device to the signal line with the first bidirectional switch when the errant device is functioning correctly.

54. A method for correcting an errant signal on a signal line within a system and providing for proper termination of an errant device, the method comprising the steps of:

decoding the errant signal from the errant device with programmable logic, to determine when the errant device should be isolated from the signal line;

isolating the device signal line from the signal line by disconnecting the device signal line from the signal line with a first bidirectional switch when the errant device functions incorrectly, wherein the first bidirectional switch is inversely controlled by an enable signal from the programmable logic;

disconnecting the programmable logic from a terminator by disabling a fourth bidirectional switch, wherein the fourth bidirectional switch is inversely controlled by the enable signal from the programmable logic;

connecting the programmable logic to the signal line with a third bidirectional switch when the errant device functions incorrectly, wherein the third bidirectional switch is controlled by the enable signal from the programmable logic;

terminating the device signal line by connecting the device signal line to a terminator with a second bidirectional switch, wherein the second bidirectional switch is controlled by the enable signal from the programmable logic;

driving the signal line to the correct level with the programmable logic, until the errant device functions correctly;

disconnecting the programmable logic from the signal line with the third bidirectional switch when the errant device functions correctly;

connecting the programmable logic to the terminator with the fourth bidirectional switch when the errant device functions correctly;

disconnecting the errant device from the terminator with the second bidirectional switch when the errant device functions correctly; and connecting the errant device to the signal line with the first bidirectional switch when the errant device is functioning correctly.

* * * * *